United States Patent
Huang et al.

(10) Patent No.: US 7,498,814 B1
(45) Date of Patent: Mar. 3, 2009

(54) MAGNET ASSEMBLY FOR MAGNETIC RESONANCE IMAGING SYSTEM

(75) Inventors: Xianrui Huang, Clifton Park, NY (US); Minfeng Xu, Ballston Lake, NY (US); Evangelos Trifon Laskaris, Schenectady, NY (US); Paul St. Mark Shadforth Thompson, Stephentown, NY (US); Bulent Aksel, Clifton Park, NY (US); Kathleen Melanie Amm, Clifton Park, NY (US); Anbo Wu, Shanghai (CN); Yan Zhao, Shanghai (CN)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 11/930,953

(22) Filed: Oct. 31, 2007

(51) Int. Cl.
*G01V 3/00* (2006.01)
(52) U.S. Cl. .................. 324/318; 324/319
(58) Field of Classification Search ......... 324/300–322; 335/216; 62/383, 51.5; 29/428
See application file for complete search history.

(56) References Cited

U.S. PATENT DOCUMENTS

| | | | |
|---|---|---|---|
| 5,668,516 A * | 9/1997 | Xu et al. ............. | 335/216 |
| 6,332,324 B1 * | 12/2001 | Saho et al. .......... | 62/51.1 |
| 6,717,408 B2 * | 4/2004 | Minas et al. ........ | 324/318 |
| 6,783,059 B2 | 8/2004 | Laskaris et al. | |
| 6,995,562 B2 | 2/2006 | Laskaris et al. | |
| 7,053,740 B1 | 5/2006 | Laskaris et al. | |
| 2008/0129297 A1 * | 6/2008 | Huang et al. ........ | 324/319 |

* cited by examiner

*Primary Examiner*—Brij B Shrivastav
(74) *Attorney, Agent, or Firm*—Jason K. Klindtworth

(57) ABSTRACT

A magnet assembly for a Magnetic Resonance Imaging (MRI) system includes a vacuum vessel including an inner cylinder, an outer cylinder and a pair of tapered flanges connecting the inner and outer cylinders. The inner cylinder is made of a composite material. The outer cylinder and flanges are composed of several magnetic segments that provide a magnetic flux return path with low eddy currents. The segments are bonded together and electrically insulated from each other. A container, a thermal shield and a superconducting magnet coil assembly are disposed within the vacuum vessel. The superconducting magnet coil assembly includes a non-conductive cylindrical structure and superconducting coils. A thermally conductive cable is wrapped around the cylindrical structure and coils to form a thermally conductive envelope.

24 Claims, 5 Drawing Sheets

MAGNET ASSEMBLY FOR MAGNETIC RESONANCE IMAGING SYSTEM

BACKGROUND

The invention relates generally to superconducting magnets, and more particularly to a low eddy current superconducting magnet assembly for a Magnetic Resonance Imaging (MRI) system.

A number of applications exist for superconducting magnets. For example, Magnetic Resonance Imaging (MRI) systems utilize superconducting magnets to generate a strong, uniform magnetic field within which a patient or other subject is placed. Magnetic gradient coils and radio-frequency transmit and receive coils then influence gyromagnetic materials in the subject to provoke signals that can be used to form useful images. Other systems that use such coils include spectroscopy systems, magnetic energy storage systems, and superconducting generators.

In many superconducting magnet assemblies, a superconducting magnet is disposed in a vacuum vessel that insulates the magnet from the environment during operation. The vacuum vessel of the MRI system and similar magnets is generally made of components that are welded together during assembly of the magnet to form a pressure boundary. The function of the vacuum vessel of an MRI magnet is to provide a reliable pressure boundary for maintaining proper vacuum operation. Vacuum vessels known in the art are usually made of metals, such as stainless steel, carbon steel and aluminum. Although, metal vacuum vessels are strong enough to resist vacuum forces, they generate eddy currents and unwanted field distortions in the imaging volume when exposed to an AC field.

The cold mass of a conventional superconducting magnet consists of one or several superconducting coils, a coil support structure and a helium vessel. The helium vessel is a pressure vessel located within the vacuum vessel for thermal isolation. Typically, liquid helium in the helium vessel provides cooling for the coils and maintains the cold mass at a temperature of around 4.2 Kelvin for superconducting operation. The coils themselves are wrapped around the coil support structure.

Metals, such as stainless steel or aluminum, are usually used to make the helium vessel. When the magnet is operated in an AC field environment, eddy currents will be induced in those metal components, generating AC losses. The AC losses add to the total heat load for the refrigeration system because the eddy currents generate heat at cryogenic temperatures, which is expensive to remove. For certain superconducting magnet applications, these AC losses can be significant and should be minimized or eliminated, if possible.

Thus, there is a need for reducing field effect losses from eddy currents, while providing desired cooling for superconducting magnets.

BRIEF DESCRIPTION

In accordance with one aspect of the invention, a magnet assembly for a Magnetic Resonance Imaging (MRI) system comprises a vacuum vessel comprising an inner cylinder, an outer cylinder concentrically disposed about the inner cylinder, and a pair of flanges for connecting the inner and outer cylinders. The outer cylinder and the pair of flanges comprise a plurality of segments made of a magnetic material that are bonded together and electrically insulated from each other. A superconducting magnet assembly is disposed within the vacuum vessel, and a thermal shield disposed within the vacuum vessel.

In accordance with another aspect of the invention, a magnet assembly for a Magnetic Resonance Imaging (MRI) system comprises a vacuum vessel comprising an inner cylinder, an outer cylinder concentrically disposed about the inner cylinder, and a pair of flanges for connecting the inner and outer cylinders. A thermal shield is disposed within the vacuum vessel, and a superconducting magnet assembly is disposed within the vacuum vessel. The superconducting magnet assembly comprises a number of superconducting coils axially positioned and supported by electrically non-conductive cylindrical spacers, and a thermally conductive cable wrapped around the cylindrical structure and the superconducting coils to form a thermally conductive envelope.

In accordance with another aspect of the invention, a magnet assembly for a Magnetic Resonance Imaging (MRI) system comprises a vacuum vessel comprising an inner cylinder, an outer cylinder concentrically disposed about the inner cylinder, and a pair of flanges for connecting the inner and outer cylinders. A thermal shield is disposed within the vacuum vessel. A superconducting magnet assembly is disposed within the vacuum vessel. The superconducting magnet assembly comprises a number of superconducting coils. A container is disposed within the vacuum vessel having at least one cooling tube connected thereto, the at least one cooling tube being in close proximity to the superconducting magnet assembly for providing cooling to the superconducting coils.

Various other features and advantages of the present invention will be made apparent from the following detailed description and the drawings.

BRIEF DESCRIPTION OF THE DRAWINGS

The drawings illustrate preferred embodiments presently contemplated for carrying out the invention.

In the drawings.

DETAILED DESCRIPTION

Figure 1:
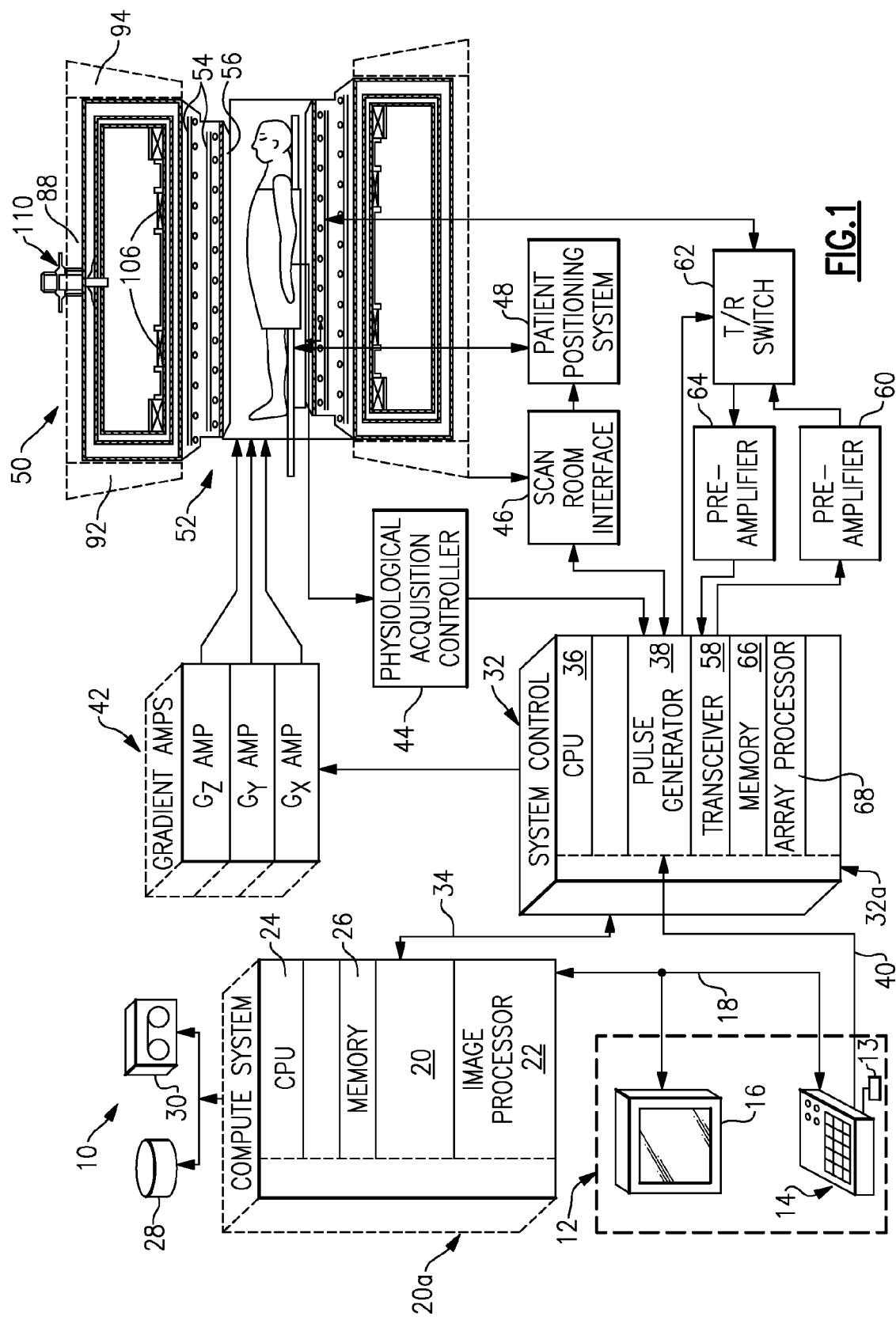
FIG. 1 is a schematic block diagram of a Magnetic Resonance Imaging (MRI) system with a vacuum vessel in accordance with an embodiment of the invention.

Referring to FIG. 1, superconducting magnet system 10 in an example comprises a superconducting magnet systems operating in an alternating current (AC) environment. Exemplary superconducting magnet systems comprise a transformer, a generator, a motor, superconducting magnet energy storage (SMES), and/or a magnetic resonance (MR) system. Although a conventional MR magnet operates in a DC mode, some MR magnets may operate under an AC magnetic field from the gradient coils when the gradient leakage field to the magnet is high. Such an AC magnetic field generates AC losses in the magnet, eddy currents, and unwanted field distortions in the imaging volume. An illustrative discussion of exemplary details of a magnetic resonance and/or magnetic resonance imaging (MRI) apparatus and/or system are presented, for explanatory purposes.

The operation of the MR system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the radio frequency (RF) pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan. The gradient waveforms produced by the pulse generator module 38 are applied to the gradient amplifier system 42 having Gx, Gy, and Gz amplifiers.

A magnet assembly 50 includes a gradient coil assembly 52, a polarizing magnet 54 and a whole-body RF coil 56. Each gradient amplifier excites a corresponding physical gradient coil in the gradient coil assembly 52 to produce the magnetic field gradients used for spatially encoding acquired signals. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the RF coil 56 during the transmit mode and to connect the preamplifier 64 to the coil 56 during the receive mode. The transmit/receive switch 62 can also enable a separate RF coil (for example, a surface coil) to be used in either transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

Figure 2:
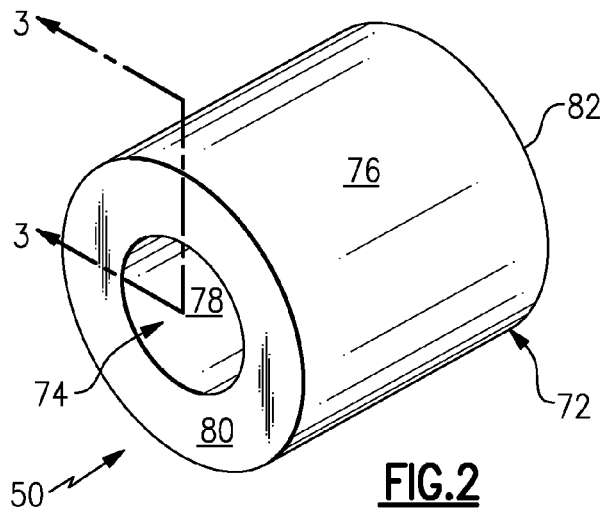
FIG. 2 is a side perspective view of an exemplary magnet assembly for used in the MRI system of FIG. 1.
Figure 3:
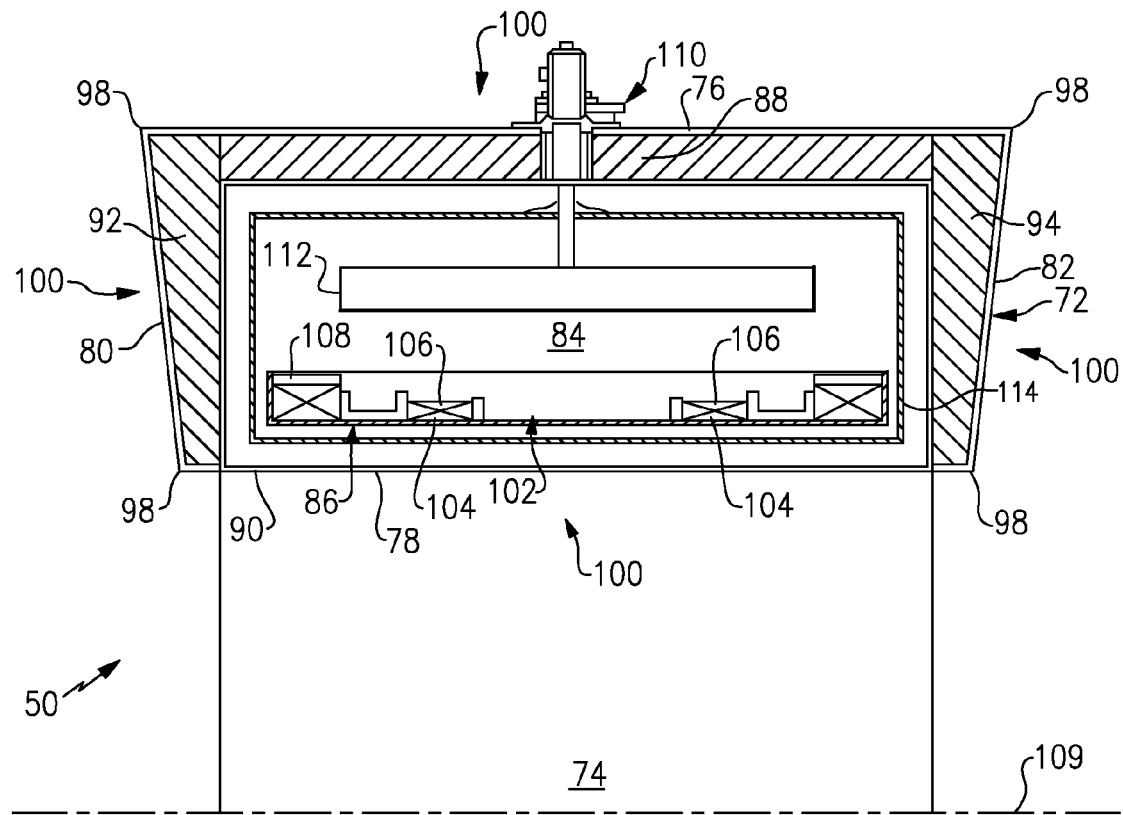
FIG. 3 is a cross-sectional view of the magnet assembly taken along line 3-3 of FIG. 2.

Referring now to FIGS. 2 and 3, the magnet assembly 50 also includes a vacuum vessel 72 defining a bore 74. As will be appreciated by those skilled in the art, in an imaging application, a subject is placed in the bore 74 for imaging (FIG. 1). Thus, the bore 74 provides access to the imaging volume for a subject. A container 112 that contains a cryogen, such as liquid helium, and the like, is disposed within the vacuum vessel 72. In one embodiment, the container 112 comprises a cylindrical or an elliptical tank made of a suitable material, such as stainless steel, and the like. A cryocooler 110 is connected to the container 112 to provide cooling to the cryogen in the container 112. At least one cooling tube 118 is connected to the container 112 to provide cooling to the superconducting coil assembly 86.

A thermal shield 114 is disposed within the vacuum vessel 72. The thermal shield 114 intercepts radiation heat from room temperature to the superconducting coil assembly 86 that is operated at the liquid helium temperature. The thermal shield 114 may be made of thermally conductive strands, such as copper, that may be co-wound, intertwined, with fiberglass strands and reinforced with, for example, epoxy to form a composite material.

The magnet assembly 50 also includes a superconducting magnet coil assembly 86 that is disposed in the vacuum volume 84 of the vacuum vessel 72 by mechanically support structures. The support structures are not shown for clarity. One embodiment of the superconducting magnet coil assembly 86 includes a bobbin-like cylindrical-shaped structure 102 with a plurality of recesses 104, as shown in FIG. 3. The cylindrical-shaped structure 102 may be made of electrically non-conductive material, such as plastic, and the like. A superconducting coil 106, which may be made of a coil of superconducting wires, such as of Nb—Ti, $Nb_3$—Sn wires, is disposed in at least one of the recesses 104.

Figure 9:
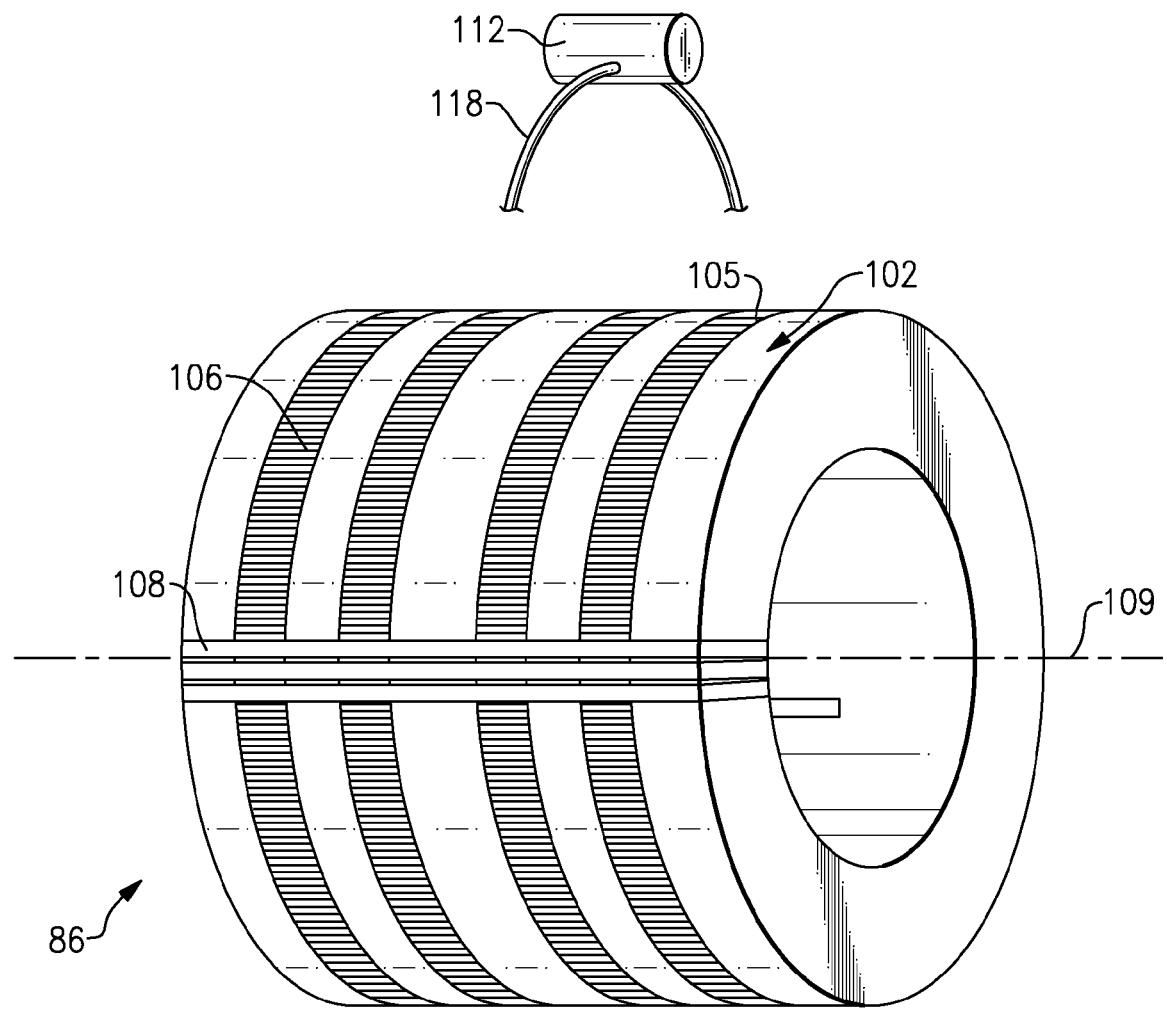
FIG. 9 is a side perspective view of a superconducting coil assembly in accordance with an embodiment of the invention.

In an alternative embodiment, the magnet coil assembly 86 can be formed by axially stacking the superconducting coils 106 and non-conductive spacers 105 along the longitudinal axis 109, as shown in FIG. 9. The spacers 105 and the coils 106 are glued or otherwise joined together to form the cylindrical-shaped structure 102. The spacers 105 position the superconducting coils 106 accurately as required by the magnetic field homogeneity in an MRI magnet, and support the electromagnetic forces between coils. In the illustrated embodiment, a total of four superconducting coils 106 are positioned between the spacers 105. The superconducting coils 106 can be wound and molded prior to being positioned between the spacers 105. The coils 106 are supported by the spacers 105 when the cylindrical-shaped structure 102 is formed. The leads of the coils 106 are routed and electrically connected to form the magnet circuit (not shown).

In either embodiment of the magnet coil assembly 86, a thermally conductive cable 108 is spiral wrapped or otherwise disposed over the cylindrical-shaped structure 102 and the superconducting coils 106 such that the cable 108 extends substantially along the longitudinal axis 109 of the magnet assembly 50 (only a portion of the spiral wrapping is shown in FIG. 9 for clarity). The thermally conductive cable 108 may be braided and made of copper, aluminum, and the like. In an embodiment, the cable 108 is commonly known as a Litz cable. The cable 108 forms a thermally conductive envelope once the cable 108 is wrapped onto the structure 102. At least one cryogenic cooling tube 118 from the container 112 is placed in close proximity to the outer diameter of the thermally conductive cable 108, such that the cryogenic cooling tube 118 is located proximate to the thermally conductive envelope, thereby enabling the cryogenic cooling system to be simpler, easy to manufacture and requiring less cryogen as compared to conventional cooling systems. In an embodiment, the thermally conductive cable 108 can be wound and bonded directly to the outer diameter of the structure 102 and to the coils 106.

As shown in FIG. 3, the vacuum vessel 72 is constructed by disposing a metallic outer cylinder 88 over a composite inner cylinder 90 in a concentric fashion. The metallic outer cylinder 88 and the composite inner cylinder 90 are closed by two magnetic annular flanges 92 and 94, to form a closed structure. The composite inner cylinder 90 may be made of a plastic or fiber material, such as but not limited to, a fiberglass material, a ceramic material, or a synthetic plastic material. Therefore, the composite inner cylinder 90 produces no eddy currents when exposed to an AC field.

The vacuum vessel 72 includes an outer lining 76, an inner lining 78, and two annular end lining flanges 80 and 82. The outer lining 76, inner lining 78, and the two annular end lining flanges 80 and 82 form a closed structure that defines a vacuum cavity 84. The outer lining 76, the inner lining 78, and the two annular end linings 80 and 82 may be made of metal, such as stainless steel, carbon steel, or aluminum. These components 76, 78, 80, and 82 may be welded or otherwise attached together at the edges to form a leak-tight pressure boundary, as designated generally by reference numeral 98. Thus, the vacuum vessel 72 that defines the vacuum cavity 84 can withstand vacuum forces, shown generally by arrows 100. Because the metallic linings 76, 78 are relatively thin, the eddy currents generated in the linings 76, 78 by the gradient pulsing fields are limited. The outer metallic lining 76 may be thicker than the inner metallic lining 78 because the outer lining 76 sees a much smaller gradient field and is farther away from the imaging volume than the inner lining 78.

Figure 4:
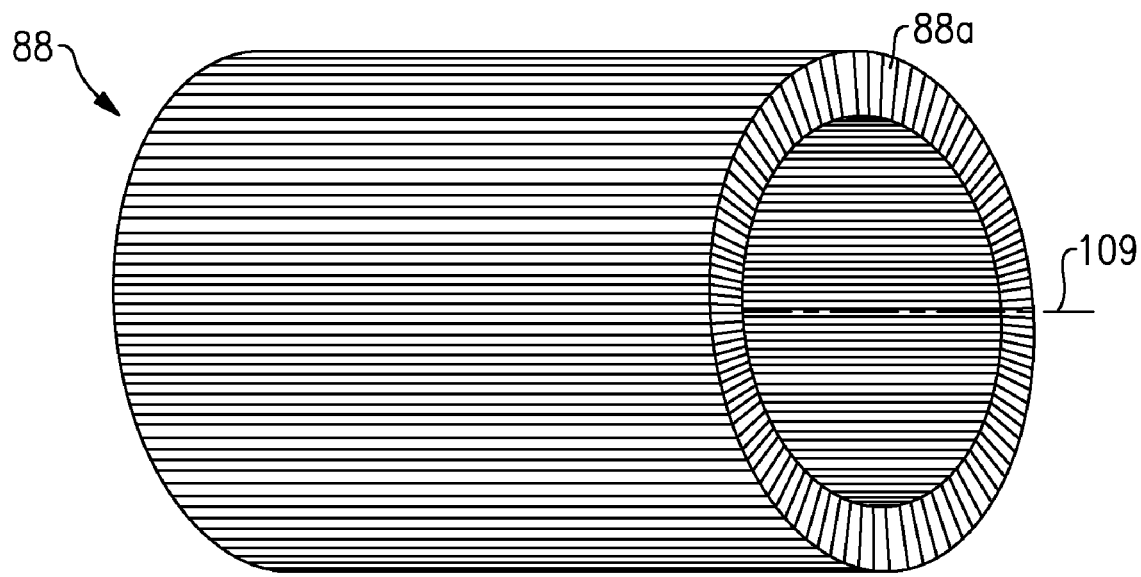
FIG. 4 is a side perspective view of an outer cylinder of the vacuum vessel for use in the MRI system of FIG. 1 in accordance with an embodiment of the invention.

Referring now to FIG. 4, the magnetic outer cylinder 88 of the vacuum vessel 72 is shown according to an embodiment of the invention. The outer cylinder 88 can be made of any desirable material that is suitable for use in the MRI system 10. In one embodiment, the outer cylinder 88 is made of a magnetic material, such as iron, and the like. The outer cylinder 88 is composed of a plurality of iron segments 88a that are in the form of an isosceles trapezoid in cross-sectional shape. The formation of the outer cylinder 88 by using the iron segments 88a suppresses eddy currents generated in the vacuum vessel 72 when exposed to an AC field, resulting in better image quality of the MRI system 10.

Figure 5:
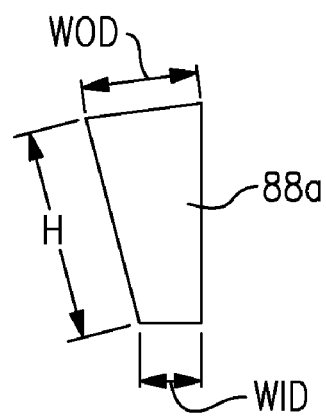
FIG. 5 is a front view of a segment of the outer cylinder shown in FIG. 4.

As shown in FIG. 5, each segment 88a has a length, L, which extends along the longitudinal axis 109 of the magnet assembly 50. Each segment 88a has an inner diameter width, WID, which is less than an outer diameter width, WOD, and a height, H, which is greater than the inner width, WID, and the outer width, WOD, to provide sufficient stiffness to the vacuum vessel 72. In other words, the width of each segment 88a continuously and gradually increases in the radial direction. The relatively thick outer cylinder 88 provides a stiff vacuum vessel structure to reduce the vibrations due to the magnetic interaction between the magnet assembly 86 and the gradient coils 54, thereby improving the magnetic field stability and the system image quality of the MRI system 10. The segments 88a are bonded to each other to form the outer cylinder 88 using a suitable material, such as epoxy, to electrically insulate the segments 88a from each other.

Figure 6:
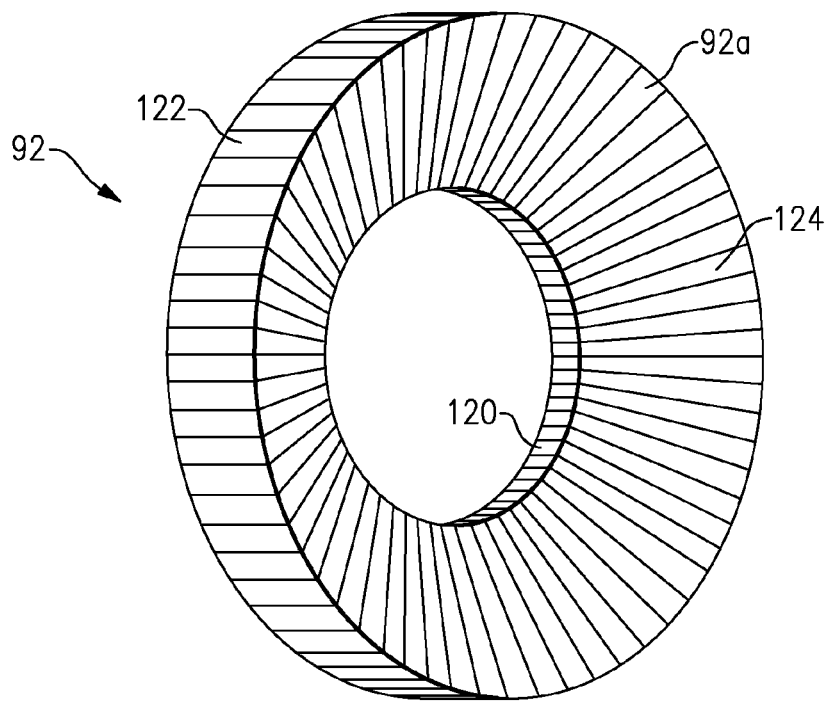
FIG. 6 is a side perspective view of a flange of the vacuum vessel for use in the MRI system of FIG. 1 in accordance with an embodiment of the invention.

Referring now to FIG. 6, the flange 92 that connects the outer and inner cylinders 88, 90 together is shown according to an embodiment of the invention. The flange 94 is substantially identical to the flange 92 and will not be separately described herein for brevity. The flange 92 can be made of any desirable material that is suitable for use in the MRI system 10. In one embodiment, the flange 92 is made of iron material. Similar to the outer cylinder 88, the flange 92 is composed of a plurality of iron segments 92a that are in the form of an isosceles trapezoid in cross-sectional shape. The formation of the flange 92 by using the iron segments 92a suppresses eddy currents generated in the vacuum vessel 72 when exposed to an AC field, resulting in better image quality of the MRI system 10. In addition, the arrangement of the outer cylinder 88 and the flanges 92, 94 provides an effective flux return path to reduce the fringe field of the magnet, and a more open configuration, which are desirable features of the MRI system 10.

Figure 7:
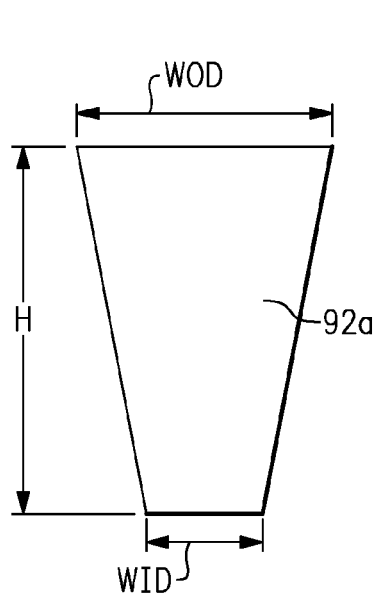
FIG. 7 is a front view of a segment of the flange shown in FIG. 6.

As shown in FIG. 7, each segment 92a has an inner diameter width, WID, which is less than an outer diameter width, WOD, and a height, H, which is greater than both the inner and outer widths to provide sufficient stiffness to the vacuum vessel 72. In other words, the width of each segment 92a continuously and gradually increases in the radial direction between the inner diameter and the outer diameter. Similar to the outer cylinder 88, the relatively thick flange 92, 94 provides a stiff vacuum vessel structure to reduce the vibrations due to the magnetic interaction between the magnet assembly 86 and the gradient coils 54, thereby improving the magnetic field stability and the system image quality of the MRI system 10. The segments 92a are bonded to each other to form the flange 92 using a suitable material, such as epoxy, to electrically insulate the segments 92a from each other.

Figure 8:
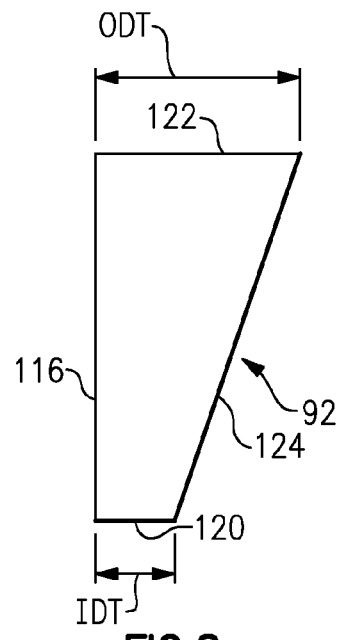
FIG. 8 is a side view of the segment of the flange shown in FIG. 7.

FIG. 8 illustrates a side view of the flange 92, 94. As shown in FIG. 8, the flange 92, 94 is trapezoidal in cross-sectional having an inner diameter thickness, IDT, which is less than an outer diameter thickness, ODT. In addition, an inner surface 116, which abuts the outer and inner cylinders 88, 90, is substantially perpendicular to an inner diameter surface 120 and an outer diameter surface 122. However, an outer surface 124 is not substantially perpendicular to any of the other surfaces 120, 122 and 124. In other words, the thickness of the flange 92, 94 continuously and gradually increases in the radial direction. Thus, the flange 92, 94 provides a tapered profile to the MRI system 10, as shown in FIG. 3. The tapered profile of the flange 92, 94 reduces the magnet length at the inner diameter and provides a more open MRI system.

This written description uses examples to disclose the invention, including the best mode, and also to enable any person skilled in the art to make and use the invention. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A magnet assembly for a Magnetic Resonance Imaging (MRI) system, comprising:
  a vacuum vessel comprising an inner cylinder, an outer cylinder concentrically disposed about the inner cylinder, and a pair of flanges for connecting the inner and outer cylinders, the outer cylinder and the pair of flanges comprising a plurality of segments made of a magnetic material that are bonded together and electrically insulated from each other;
  a superconducting magnet coil assembly disposed within the vacuum vessel; and
  a thermal shield disposed within the vacuum vessel.

2. The assembly of claim 1, further comprising a container disposed within the vacuum vessel for providing cooling to the superconducting magnet coil assembly.

3. The assembly of claim 2, further comprising a cryocooler connected to the container for providing a cryogen to the container.

4. The assembly of claim 1, further comprising a gradient coil assembly, a polarizing magnet and a whole-body RF coil.

5. The assembly of claim 1, wherein the thermal shield is made of a composite material.

6. The assembly of claim 1, wherein the inner cylinder of the vacuum vessel is made of a composite material.

7. The assembly of claim 1, wherein the vacuum vessel further includes an outer lining, an inner lining, and two annular end lining flanges that form a closed, leak tight structure.

8. The assembly of claim 1, wherein the superconducting magnet coil assembly further comprises a non-conductive cylindrical structure having at least one recess, a superconducting coil disposed in the at least one recess, and a metallic cable wrapped around the cylindrical structure and the superconducting coil to form a thermally conductive envelope.

9. The assembly of claim 1, wherein the superconducting magnet coil assembly comprises a number of superconducting coils axially positioned and supported by electrically non-conductive cylindrical spacers, and a thermally conductive cable wrapped around the cylindrical spacers and the superconducting coils to form a thermally conductive envelope.

10. The assembly of claim 1, wherein each segment is an isosceles trapezoid in cross-sectional shape.

11. The assembly of claim 1, wherein each flange has an inner surface, an outer surface, an inner diameter surface and an outer diameter surface, and wherein the inner surface abuts the inner and outer cylinders, and wherein the inner surface is substantially perpendicular to the inner diameter surface and the outer diameter surface, and wherein the outer surface is not substantially perpendicular to the inner surface and the inner and outer diameter surfaces.

12. A magnet assembly for a Magnetic Resonance Imaging (MRI) system, comprising:
  a vacuum vessel comprising an inner cylinder, an outer cylinder concentrically disposed about the inner cylinder, and a pair of flanges for connecting the inner and outer cylinders;
  a thermal shield disposed within the vacuum vessel; and
  a superconducting magnet coil assembly disposed within the vacuum vessel, wherein the superconducting magnet assembly comprises a number of superconducting coils axially positioned and supported by electrically non-conductive cylindrical spacers, and a thermally conductive cable wrapped around the cylindrical spacers and the superconducting coils to form a thermally conductive envelope.

13. The assembly of claim 12, further comprising a container disposed within the vacuum vessel and configured to contain a cryogen having at least one cooling tube connected thereto, the at least one cooling tube being disposed about the superconducting magnet coil assembly for providing cooling to the superconducting coils.

14. The assembly of claim 13, further comprising a cryocooler for providing the cryogen to the container.

15. The assembly of claim 12, further comprising a gradient coil assembly, a polarizing magnet and a whole-body RF coil.

16. The assembly of claim 12, wherein the thermal shield is made of a composite material.

17. The assembly of claim 12, wherein the inner cylinder of the vacuum vessel is made of a composite material.

18. The assembly of claim 12, wherein the vacuum vessel further includes an outer lining, an inner lining, and two annular end lining flanges that form a closed structure.

19. The assembly of claim 12, wherein the outer cylinder and the pair of flanges comprises a plurality of segments made of a magnetic material that are bonded together and electrically insulated from each other.

20. The assembly of claim 19, wherein each segment is an isosceles trapezoid in cross-sectional shape.

21. The assembly of claim 19, wherein each flange has an inner surface, an outer surface, an inner diameter surface and an outer diameter surface, and wherein the inner surface abuts the inner and outer cylinders, and wherein the inner surface is substantially perpendicular to the inner diameter surface and the outer diameter surface, and wherein the outer surface is not substantially perpendicular to the inner surface and the inner and outer diameter surfaces.

22. A magnet assembly for a Magnetic Resonance Imaging (MRI) system, comprising:
  a vacuum vessel comprising an inner cylinder, an outer cylinder concentrically disposed about the inner cylinder, and a pair of flanges for connecting the inner and outer cylinders;
  a thermal shield disposed within the vacuum vessel;
  a superconducting magnet coil assembly disposed within the vacuum vessel, the superconducting magnet coil assembly comprising a number of superconducting coils; and
  a container disposed within the vacuum vessel having at least one cooling tube connected thereto, the at least one cooling tube being in close proximity to the superconducting magnet coil assembly for providing cooling to the superconducting coils.

23. The assembly of claim 22, wherein the number of superconducting coils are axially positioned and supported by electrically non-conductive cylindrical spacers, and a thermally conductive cable wrapped around the cylindrical spacers and the superconducting coils to form a thermally conductive envelope.

24. The assembly of claim 22, wherein the outer cylinder and the pair of flanges comprises a plurality of segments made of a magnetic material that are bonded together and electrically insulated from each other.

* * * * *